United States Patent

Sakamoto

[11] Patent Number: 6,136,385
[45] Date of Patent: Oct. 24, 2000

[54] SURFACE REFORMING METHOD OF A METAL PRODUCT

[75] Inventor: Yasuaki Sakamoto, Kameoka, Japan

[73] Assignee: Saatec Engineering Corporation, Japan

[21] Appl. No.: 09/362,742

[22] Filed: Jul. 29, 1999

[51] Int. Cl.[7] .............................. C23C 14/16; C23C 14/48
[52] U.S. Cl. ........................ 427/530; 427/528; 427/531; 427/135; 148/239; 148/900; 148/DIG. 83
[58] Field of Search ...................................... 427/135, 528, 427/531, 534, 530, 576, 577; 204/192.15, 192.16; 148/239, 278, 900, DIG. 83

[56] References Cited

U.S. PATENT DOCUMENTS

| | | | |
|---|---|---|---|
| 3,900,636 | 8/1975 | Curry et al. ............................ | 427/38 |
| 4,137,370 | 1/1979 | Fujishiro et al. ...................... | 427/38 |
| 4,855,026 | 8/1989 | Sioshansi ............................... | 148/4 |
| 4,969,944 | 11/1990 | Marechal et al. ..................... | 65/104 |

*Primary Examiner*—Shrive Beck
*Assistant Examiner*—Kirsten A. Crockford
*Attorney, Agent, or Firm*—Evenson, McKeown, Edwards & Lenahan, P.L.L.C.

[57] ABSTRACT

A surface reforming method of a metal product, wherein a platinum film is formed on the surface of a metal product by injecting onto that surface a nitrogen ion, a carbon ion and a platinum ion in that order, and then injected onto said platinum film a second platinum ion with the aim of improving the exfoliation resistance of the platinum film being formed on the metal surface, and the abrasion resistance of the surface.

8 Claims, No Drawings

SURFACE REFORMING METHOD OF A METAL PRODUCT

BACKGROUND OF THE INVENTION

1. Field of the Invention

This invention relates to a surface reforming method for such metal products as a mold for press molding a glass product, a mold for forging or press molding a metal product, and a mold for injection molding a plastic product.

2. Description of Prior Art and Problem to be Solved by the Invention

A mold for press molding glass products such as a glass optical disc substrate to be used as optical disc memory for a computer, video, audio, and the like, a glass hard disc substrate to be used for a computer, a glass lens to be used as an optical component, the front glass of a cathode-ray tube for a TV set, computer display, and the like, or a glass substrate disc and the like for a liquid crystal display has been known to be one in which that a platinum film is formed on a molding face of a mold comprising stainless steel, a refractory metal, and the like, with the aim of improving both the mold release and oxidation resistance. Also, as to a mold for forging or press molding a metal product and a mold for injection molding a plastic product, it has also been known that a platinum film is formed on the molding face with the aim of improving its exfoliation resistance and oxidation resistance.

However, a conventional mold for press molding a glass product has such a shortfall in the case of continuous press molding that exfoliation of the platinum film and abrasion of the molding face occur, causing the mold to have a relatively life of 10,000–20,000 shots. Therefore, the entire mold has to be replaced in a relatively short time, resulting in a high cost.

The purpose of this invention is to provide a surface reforming method for a metal product by solving the above problems and to improve both the exfoliation resistance of the platinum film formed on the surface of the metal product and the abrasion resistance of the surface.

DETAILED DESCRIPTION OF THE INVENTION

Means of Solving the Problems, and the Effects of the Invention

A surface reforming method of a metal product, wherein a platinum film is formed after a platinum ion is injected onto the surface of the metal product after which another platinum ion also is injected onto the surface.

According to a method of the present invention, a platinum ion that is injected first, a platinum ion in the platinum film, and a platinum ion that is injected afterwards are assimilatory combined, resulting in an improvement of both the adhesion of the platinum film to the metal product, and of the exfoliation resistance of the platinum film. Furthermore, the abrasion resistance of the metal product is improved. Therefore, the life of the metal mold product is increased, and the replacement cycle becomes longer, resulting in reduced costs. Furthermore, the oxidation resistance of the platinum film is not harmed, and especially the mold release of a product molded with these molds is not harmed, even in the case of a mold for press molding a glass product, a mold for forging or press molding a metal product, or a mold for injection molding a plastic product.

In a method of the present invention, it is desirable that the injection of a platinum ion before and after the formation of the platinum film is conducted under conditions such that the injection volume is $1-5\times10^{15}$ ions/cm$^2$, the acceleration voltage is 10–200 kev, and the ion current is 10–100 mA. These ranges have been determined through various experiments. Also, it is desirable that the film thickness of the platinum film that was formed is 0.1–0.5 μm. If the film thickness of the platinum film is less than 0.1 μm, it is difficult to form a platinum film evenly and thickness dispersion is generated on the film, and if the thickness exceeds 0.5 μm, the volume of a platinum ion to be injected after the formation of a platinum film has to be increased, resulting in the risk that the surface of the metal product chaps.

The surface reforming method of a metal product in another embodiment of the present invention, is such that a platinum film is formed after a nitrogen ion and a platinum ion are injected onto the surface of a metal product in that order and, furthermore, a second platinum ion is then to be injected.

According to a method of the present invention, the strength of the mother member of a metal product is increased and the abrasion resistance is improved by the injection of a nitrogen ion. Also, the platinum ion that is injected first, the platinum ion in the platinum film, and the platinum ion that is injected afterwards are assimilatory combined, resulting in the improvement of both the adhesion of the platinum film to the metal product and the exfoliation resistance of the platinum film. Therefore, the life of the metal product is increased, and the replacement cycle becomes longer, resulting in reduced costs. Furthermore, the oxidation resistance of the platinum film is not harmed, and, especially the mold release of the product molded with these molds is not harmed, even in the case of a mold for press molding a glass productor a mold for forging or press molding a metal product.

In a method of the present invention, it is desirable that the injection of a nitrogen ion is conducted under the conditions that the injection volume is $1-5\times10^{15}$ ions/cm$^2$, the acceleration voltage is 10–100 kev, and the ion current is 10–100 mA. These ranges have been determined through various experiments. It is desirable that the injection of a platinum ion before and after the formation of the platinum film is conducted under the conditions that the injection volume is $1-5\times10^{17}$ ions/cm$^2$, the acceleration voltage is 10–200 kev, and the ion current is 10–100 mA. These ranges have been determined through various experiments. Also, it is desirable that the thickness of the platinum film to be formed is 0.1–0.5 μm.

A surface reforming method of a metal product another embodiment of the present invention, is such that a platinum film is formed after a nitrogen ion, a carbon ion, and a platinum ion are injected in that order onto the surface of a metal product and, furthermore, a platinum ion is to be injected.

According to a method of the present invention, the strength of the mother member of a metal product is increased and its abrasion resistance is improved by the injection of a nitrogen ion and a carbon ion. Also, the platinum ion that is injected first, the platinum ion in the platinum film, and the platinum ion that is injected afterwards are assimilatory combined, resulting in the improvement of both the adhesion of the platinum film to the metal product and the exfoliation resistance of the platinum film. Therefore, the life of the metal product is increased, and the replacement cycle becomes longer, resulting in reduced costs. Furthermore, in the case that the metal product is a mold for press molding a glass product, a mold for forging or press molding a metal product, or a mold for injection molding a plastic product, the mold release of the product molded with any of these molds is improved by the injection of a carbon ion. Also, the oxidation resistance of the platinum film is not be harmed.

In a method of the present invention, it is desirable that is conducted under the conditions that the injection volume is $1-5 \times 10^{15}$ ions/cm$^2$, the acceleration voltage is 10–100 kev, and the ion current is 10–100 mA. These ranges have been determined through various experiments. It is desirable that the injection of a carbon ion is conducted under the conditions that the injection volume is $1-3 \times 10^{17}$ ions/cm$^2$, the acceleration voltage is 10–100 kev, and the ion current is 10–100 mA. These ranges have been determined through various experiments. It is desirable that the injection of the platinum ion before and after the formation of the platinum film is conducted under the conditions that the injection volume is $1-5 \times 10^{17}$ ions/cm$^2$, the acceleration voltage is 10–200 kev, and the ion current is 10–100 mA. These ranges have been determined through various experiments. Also, it is desirable that the thickness of the platinum film to be formed is 0.1–0.5 μm.

The metal products in according to the present invention are, for example, molds for press molding glass products.

Also, the metal products are formed with the use of, for example, stainless steel, a refractory metal, an alloy jig steel for a hot molding mold, and the like.

The present invention can be applied for surface reformations of metal products such as not only a mold for press molding a glass product, but also a mold for forging or press molding a metal product, a mold for injection molding a plastic product and a tool, and so forth.

THE EMBODIMENT OF THE INVENTION

The following are examples of the invention, along with a comparative example.

EXAMPLE 1

Platinum ions are injected onto the surface of a molding face of a mold for press molding a glass substrate for a hard disk being formed with JIS SUS306 under the conditions that the injection volume is $1 \times 10^{15}$ ions/cm$^2$, the accelerating voltage is 100 kev, and the ion current is 50 mA. Then, a platinum film with a thickness of 0.1 μm is formed by a spattering method. Thereafter, platinum ions are injected under the conditions that the injection volume is $1 \times 10^{15}$ ions/cm$^2$, the accelerating voltage is 100 kev, and the ion current is 50 mA. Thus, the surface of a mold is reformed.

To evaluate such a mold, a press working is applied to an alkali zinc borosilicate base glass substrate (with a diameter of 86 mm, and a thickness of 1.2 mm) under the conditions that the mold temperature is 555–560° C. and the press pressure is 48.5 t, so as to mold a glass substrate for a hard disk with a diameter of 88–90 mm and a thickness of 0.8 mm. Even though the molding is continuously carried out in this way, exfoliation of the platinum film is not recognized until 133,900 shots have been made. Further, after 133,900 shots of continuous molding, no abrasion is recognized on the molding face of the mold.

EXAMPLE 2

Nitrogen ions are injected onto the surface of a molding face of a mold for press molding a glass substrate for a hard disk being formed with JIS SUS306 under the conditions that the injection volume is $1 \times 10^{15}$ ions/cm$^2$, the accelerating voltage is 100 kev, and the ion current is 50 mA. Then platinum ions are injected onto the surface of the molding face of the mold under the conditions that the injection volume is $1 \times 10^{17}$ ions/cm$^2$, the accelerating voltage is 100 kev, and the ion current is 50 mA. Thereafter, a platinum film with a thickness of 0.1 μm is formed on the surface of the molding face of the mold by a spattering method. Then platinum ions are again injected onto the surface of the mold under the conditions that the injection volume is $1 \times 10^{17}$ ions/cm$^2$, the accelerating voltage is 100 kev, and the ion current is 50 mA. Thus, the surface of the mold is reformed.

By using such a mold, a glass substrate for a hard disk is continuously press-molded under the same conditions as in the above Example 1, except that the mold temperature is 590–595° C. As a result, exfoliation of the platinum film is not recognized until 930,000 shots of continuous molding have been made. Further, after 930,000 shots of continuous molding, abrasion is recognized only to the extent of 0.008–0.01 mm.

EXAMPLE 3

Nitrogen ions are injected onto the surface of a molding face of a mold for press molding a glass substrate for a hard disk being formed with JIS SUS306 under the conditions that the injection volume is $5 \times 10^{15}$ ions/cm$^2$, the accelerating voltage is 100 kev, and the ion current is 50 mA. Then carbon ions are injected onto the surface of the molding face of the mold under the conditions that the injection volume is $1 \times 10^{17}$ ions/cm$^2$, the accelerating voltage is 100 kev, and the ion current is 50 mA. Thereafter, platinum ions are injected onto the surface of the molding face of the mold under the conditions that the injection volume is $1 \times 10^{17}$ ions/cm$^2$, the accelerating voltage is 100 kev, and the ion current is 50 mA. Thus, the surface of the mold is reformed.

By using such a mold, a glass substrate for a hard disk is continuously press-molded under the same conditions as in the above Example 1, except that the mold temperature is 590–600° C. As a result, exfoliation of the platinum film is not recognized until 1,410,000 shots of continuous molding have been made. Further, after 1,410,000 shots of continuous molding, abrasion is recognized at the center part of the molding face of the mold only to the extent of 0.01–0.05 mm, and abrasion is also recognized at the same peripheral part and only to the extent of 0.008–0.01 mm.

EXAMPLE 4

Nitrogen ions are injected onto the surface of a molding face of a mold for press molding a glass substrate for a hard disk being formed with a WC—Co base hard metal (JIS K20) under the conditions that the injection volume is $5 \times 10^{15}$ ions/cm$^2$ the accelerating voltage is 100 kev, and the ion current is 50 mA. Then palladium ions are injected onto the surface of the molding face of the mold under the conditions that the injection volume is $1 \times 10^{15}$ ions/cm$^2$, the accelerating voltage is 100 kev, and the ion current is 50 mA. Thereafter, carbon ions are injected onto the surface of the molding face of the mold under the conditions that the injection volume is $1 \times 10^{17}$ ions/cm$^2$, the accelerating voltage is 100 kev, and the ion current is 50 mA. Then platinum ions are injected onto the surface of the mold under the conditions that the injection volume is $2 \times 10^{17}$ ions/cm$^2$, the accelerating voltage is 100 kev, and the ion current is 50 mA, and a platinum film with the thickness of 0.1 μm is formed on the surface of the molding face of the mold. Thereafter, platinum ions are injected onto the surface of the molding face of the mold under the conditions that the injection volume is $1\times10^{17}$ ions/cm$^2$, the accelerating voltage is 100 Kev, and the ion current is 50 mA. Thus, the surface of the mold is reformed.

By using such a mold, a glass substrate for a hard disk is press-molded under the same conditions as in the above Example 1, except that the mold temperature is 670–680° C.

As a result, peeling of the platinum film is not recognized until 1,210,000 shots of continuous molding have been made. Further, after 1,210,000 shots of continuous molding, abrasion is recognized only to the extent of 0.008–0.01 mm.

COMPARATIVE EXAMPLE

A platinum film with the thickness of 0.5 μm is formed on the surface of a molding face of a mold for press molding a glass substrate for a hard disk being formed with JIS SUS306 by a spattering method.

By using such a mold, the glass substrate for the hard disk is continuously press-molded under the same conditions as in the above Example 1, except that the mold temperature is 590–600° C. As a result, exfoliation of the platinum film is recognized at 10,000 shots of continuous molding. Further, after 10,000 shots of continuous molding, abrasion is recognized only to the extent of 0.05–0.08 mm.

What is claimed is:

1. A surface reforming method of a metal product, comprising:

injecting platinum ions into a surface of the metal product;

then forming a platinum film on the surface; and after having formed said platinum film, further injecting platinum ions into said platinum film.

2. A surface reforming method of a metal product, comprising:

injecting nitrogen ions and platinum ions in that order into a surface of the metal product;

then forming a platinum film on the surface; and after having formed said platinum film, further injecting platinum ions into said platinum film.

3. A surface reforming method of a metal product, comprising:

injecting nitrogen ions, carbon ions and platinum ions in that order into a surface of the metal product;

then forming a platinum film on the surface; and after having formed said platinum film, further injecting platinum ions into said platinum film.

4. A surface reforming method as claimed in claim 1, wherein the metal product is a mold for press molding a glass product.

5. A surface reforming method as claimed in claim 2, wherein the metal product is a mold for press molding a glass product.

6. A surface reforming method as claimed in claim 3, wherein the metal product is a mold for press molding a glass product.

7. A surface reforming method as claimed in claim 1, wherein the platinum ions injected into the surface of the metal product, platinum ions in the platinum film, and the platinum ions injected into said platinum film are combined.

8. A surface method according to claim 1, wherein said platinum film consists of platinum.

* * * * *